United States Patent
Khater

(10) Patent No.: US 7,482,673 B2
(45) Date of Patent: Jan. 27, 2009

(54) STRUCTURE AND METHOD FOR BIPOLAR TRANSISTOR HAVING NON-UNIFORM COLLECTOR-BASE JUNCTION

(75) Inventor: Marwan H. Khater, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/953,751

(22) Filed: Sep. 29, 2004

(65) Prior Publication Data

US 2006/0065951 A1     Mar. 30, 2006

(51) Int. Cl.
*H01L 29/70* (2006.01)
(52) U.S. Cl. ............... 257/593; 257/586; 257/E29.171; 438/350; 438/343
(58) Field of Classification Search ................. 257/197, 257/198, 200, 201, 183, 565, 592, 593, 586, 257/E29.171, E29.172; 438/312–321, 357, 438/309, 235, 350, 343
See application file for complete search history.

(56) References Cited

U.S. PATENT DOCUMENTS

| 6,285,044 | B1 * | 9/2001 | Bhat ........................ 257/197 |
| 6,482,710 | B2 * | 11/2002 | Oda et al. ................. 438/311 |
| 6,521,974 | B1 * | 2/2003 | Oda et al. ................. 257/593 |
| 6,759,697 | B2 * | 7/2004 | Toyoda et al. ............. 257/197 |
| 2002/0158313 | A1 * | 10/2002 | Takagi et al. ............... 257/593 |

\* cited by examiner

*Primary Examiner*—Douglas M Menz
*Assistant Examiner*—Steven J. Fulk
(74) *Attorney, Agent, or Firm*—Daryl Neff; H. Daniel Schnurmann

(57) ABSTRACT

A bipolar transistor is provided which includes a collector region, an intrinsic base region overlying the collector region and an emitter region overlying the intrinsic base region. An extrinsic base overlies a portion of the intrinsic base region. An epitaxial spacer layer is disposed between the collector region and the intrinsic base region in locations not underlying the emitter region.

14 Claims, 8 Drawing Sheets

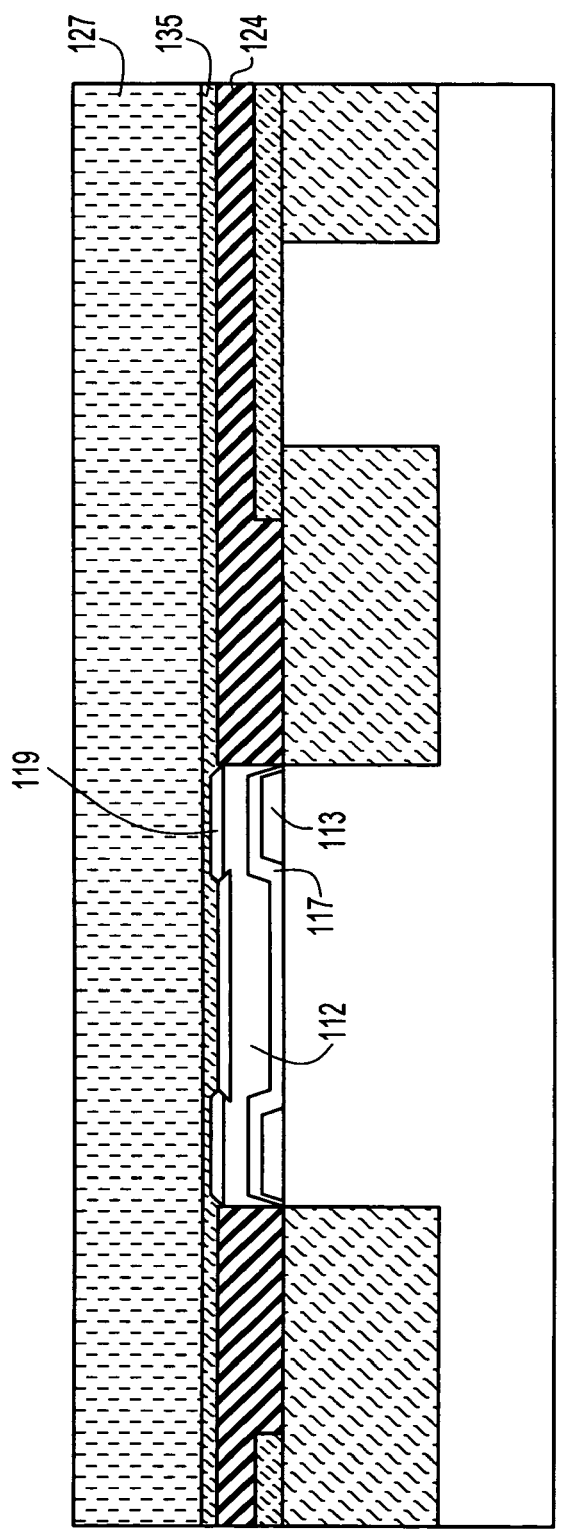
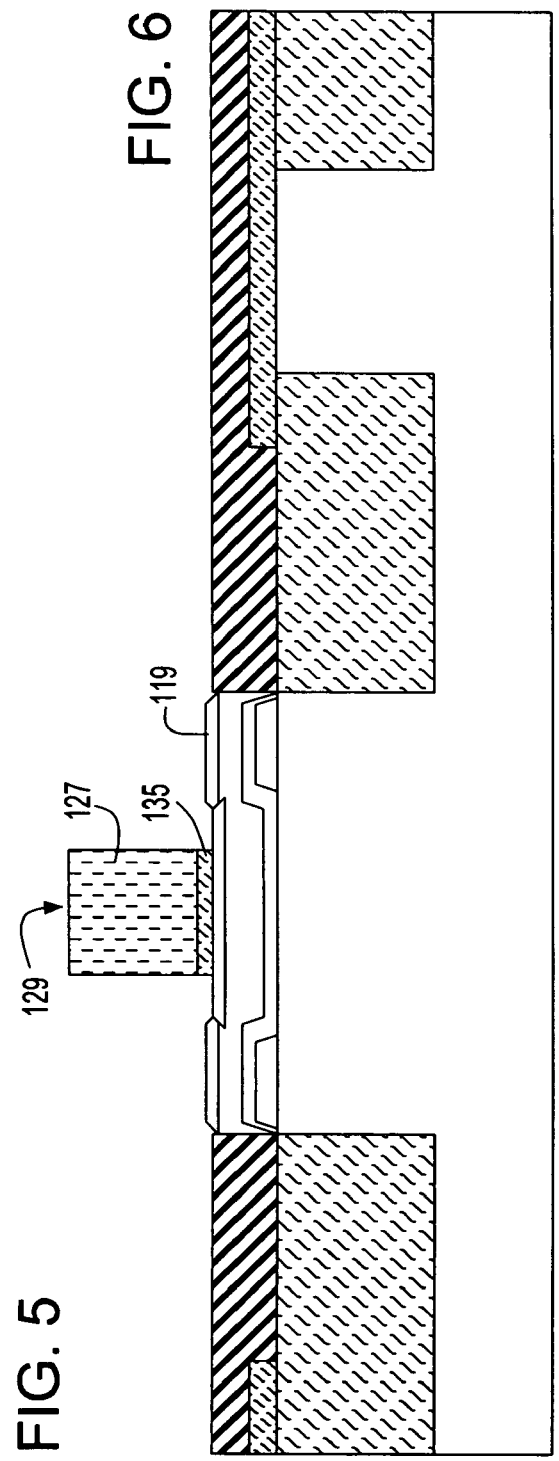

STRUCTURE AND METHOD FOR BIPOLAR TRANSISTOR HAVING NON-UNIFORM COLLECTOR-BASE JUNCTION

BACKGROUND OF THE INVENTION

The present invention relates to transistors and their fabrication. More specifically, the invention relates to bipolar transistors.

Cutoff frequency ($f_T$) and maximum oscillation frequency ($f_{max}$) are the most representative measures of high-speed transistors performance. Hence, the design and optimization efforts for high-speed transistors are mostly directed toward maximizing these two parameters. $F_{max}$ is a function of $f_T$ and of parasitic resistances and parasitic capacitances (collectively referred to herein as "parasitics") between elements of the transistor according to the formula $f_{max}=(f_T/8\pi*C_{cb}*R_b)^{1/2}$. As indicated by the equation, one of the device parameters that influence $f_T$ and $f_{max}$ is the base to collector capacitance ($C_{cb}$). $C_{cb}$ is a parasitic capacitance whose value is a consequence of the particular structure and method used to fabricate the transistor. Its value has a limiting effect on the value of $f_{max}$.

FIG. 1 is a diagram illustrating the structure of a prior art bipolar transistor 10. As illustrated therein, $C_{cb}$ is made up of several capacitance components in parallel, including the intrinsic capacitance $C_{cb}$(intrinsic) 12 between the base and collector in the intrinsic region, and the parasitic capacitance $C_{cb}$(extrinsic) 15, which includes $C_{cb}$(extrinsic base) 14 between the extrinsic base and the collector, and the capacitance $C_{cb}$(STI) 16 across the shallow trench isolation (STI). More than two-thirds of total $C_{cb}$ comes from the extrinsic parasitic portion $C_{cb}$(extrinsic). This parasitic capacitance results from the overlap between the collector and base regions outside the active intrinsic transistor region that is located under the emitter. The overlap area between these regions cannot be easily minimized by lithography, due to limitations imposed by overlay and alignment tolerances. The value of this parasitic capacitance is a function of the concentration of dopants at the junction between the collector and base regions. A high concentration of dopants results in the junction between the two regions having a narrow depletion region width. In such case, a relatively high capacitance results, as understood from the equation for the capacitance of a C=kA/d, where C is the value of the capacitance, A is the overlap area between the base and the collector, and the distance d is the width of the depletion region at the junction. The depletion width of the junction between collector and the base region is subject to being decreased during fabrication by transport enhanced diffusion of dopants from the base region to the collector region, which further increases the parasitic capacitance.

In view of the foregoing, it would be desirable to provide a bipolar transistor structure and method of fabricating a bipolar transistor in which the junction depletion region width between the collector region and the extrinsic portion of the base region is increased, to reduce the parasitic extrinsic component of $C_{cb}$ without adversely affecting other device parameters.

SUMMARY OF THE INVENTION

Accordingly, in an aspect of the invention, a bipolar transistor structure and method are provided in which the extrinsic component of $C_{cb}$ is reduced. In a bipolar transistor structure according to one aspect of the invention, a non-doped or at most lightly doped epitaxial semiconductor spacer including, for example, silicon (Si), silicon germanium (SiGe), or silicon carbon (Si:C) is disposed between the collector and the base in the extrinsic region. The spacer layer increases the width of a depletion region between the base and collector in the extrinsic region. According to a highly preferred aspect of the invention, the epitaxial layer is provided of silicon carbon (Si:C) or silicon germanium (SiGe) as a material to reduce transport enhanced diffusion of extrinsic base dopants to the collector region and vice versa, Such spacer acts to increase the depletion region width between the extrinsic base and collector regions, which results in a lower extrinsic component of $C_{cb}$ and allows a higher $f_{max}$ to be achieved.

According to an aspect of the invention, a bipolar transistor is provided which includes a collector region, an intrinsic base region overlying the collector region and an emitter region overlying the intrinsic base region. An extrinsic base overlies a portion of the intrinsic base region. An epitaxial spacer layer is disposed between the collector region and the intrinsic base region in locations not underlying the emitter region.

BRIEF DESCRIPTION OF THE DRAWINGS

FIGS. 3-10 illustrate stages in fabrication of a bipolar transistor according to an embodiment of the invention.

DETAILED DESCRIPTION

Figure 1:
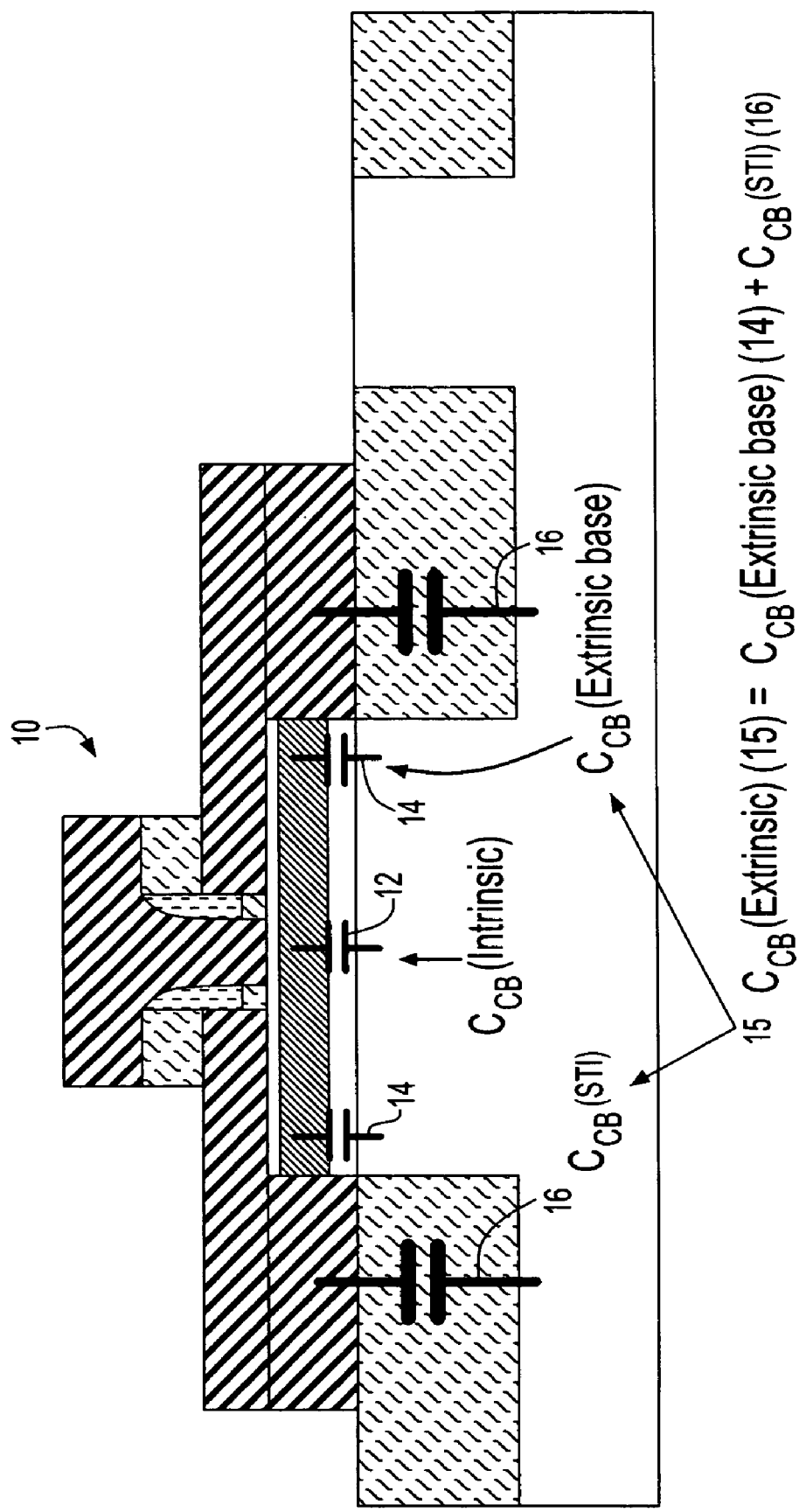
FIG. 1 is a diagram illustrating the structure of a prior art bipolar transistor.
Figure 2:
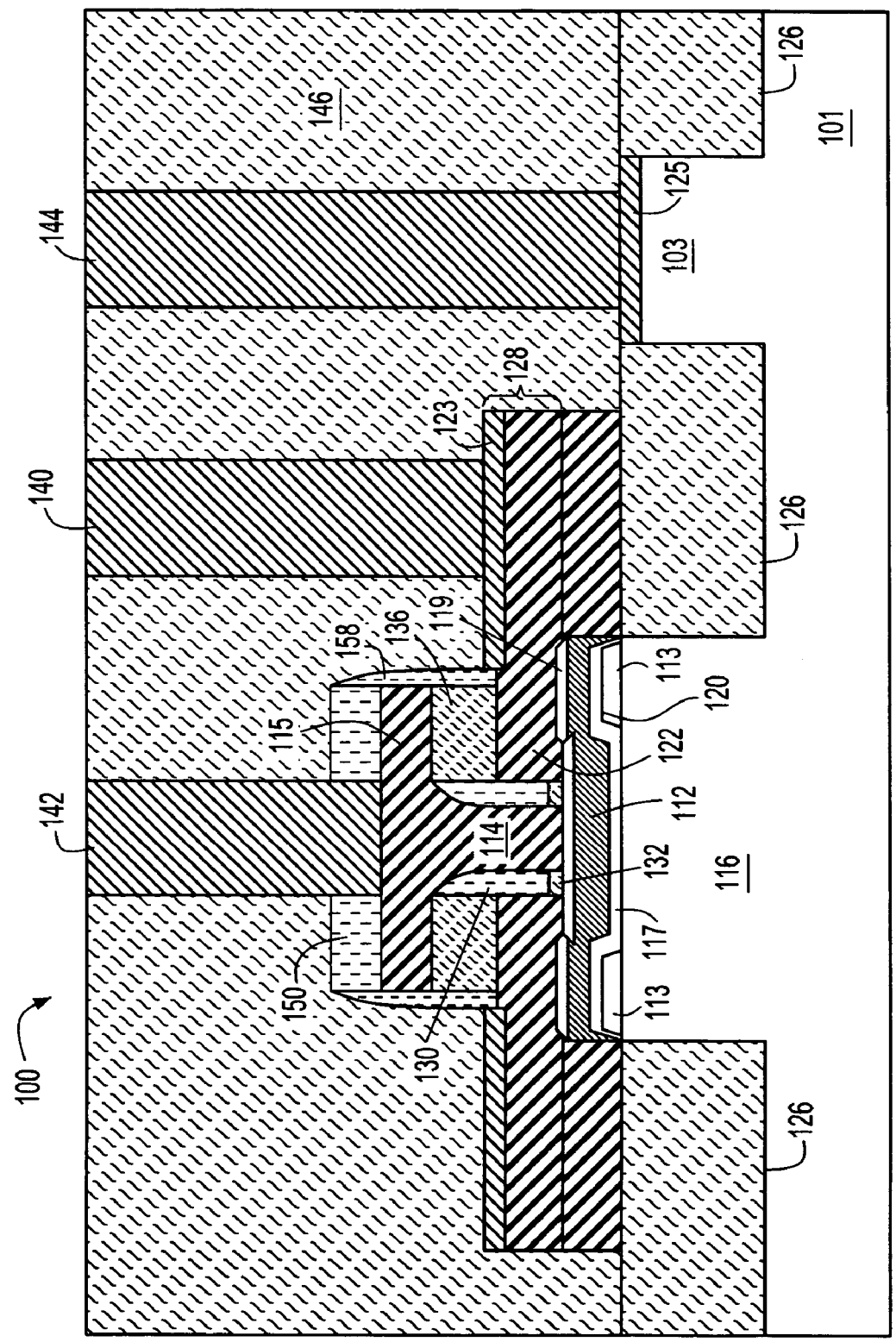
FIG. 2 illustrates a bipolar transistor according to an embodiment of the invention.

FIG. 2 is a cross-sectional view illustrating a bipolar transistor 100 according to an embodiment of the invention. As shown in FIG. 2, transistor 100 is desirably fabricated on a substrate 101, e.g. wafer, of single-crystal silicon. The transistor 100 includes a collector region 116 disposed within an active area that is partially or fully surrounded by a shallow trench isolation 126. An intrinsic base layer 112 including a layer of single-crystal semiconductor such as silicon or an alloy thereof such as silicon germanium (SiGe) overlies the collector region 116. An emitter region 114 overlies a central region of the intrinsic base layer 112.

A raised extrinsic base 128 for the transistor 100 is provided, which includes an extrinsic base polysilicon layer 122 of semiconductor material such as polysilicon, that layer (hereinafter, "poly layer 122") overlying the intrinsic base layer 112. Preferably, the collector region 116 and emitter region 114 consist essentially of silicon.

A novel feature of the present invention is the epitaxial spacer layer 113 disposed between portions of the poly layer 122 (and intrinsic base layer 112 there under) and the collector region 116. The epitaxial spacer layer is provided of a single-crystal semiconductor material that functions as a spacer for the diffusion of dopants and can be a low diffusion rate material. The function of the spacer layer is to produce a junction between the intrinsic base layer 112 and the collector region 116 that has a relatively low carrier concentration, in order to increase the width of the junction depletion region at the interface, thus reducing the parasitic junction capacitance Ccb(extrinsic) at the interface. Optimally, the spacer layer 113 has a non-existent or very slight dopant concentration, the spacer layer 113 preferably being formed in a manner that is referred to as "not intentionally doped", because the efficacy of the spacer layer depends upon the degree to which a low dopant concentration is achieved in the region between the intrinsic base layer 112 and the collector layer 116. However, it may still be possible to achieve a sizable reduction in Ccb(extrinsic), even if the spacer layer 113 is very lightly doped as first formed or when the transistor is completed. As an illustrative example, and without limitation, reduced Ccb (extrinsic) can be achieved when the final dopant concentration at the top 120 of the spacer layer 113 has a value such as $10^{14}$ cm$^{-3}$.

Preferably, an intrinsic, i.e., a not intentionally doped silicon epitaxial layer 119 is provided overlying the intrinsic base layer 112 in the region underlying the emitter region 114 and also the region underlying the poly layer 122. Another such intrinsic silicon epitaxial layer 117 having similar properties overlies the collector region 116 and the epitaxial spacer layer 113 under the intrinsic base layer 112, acting to further space the intrinsic base layer 112 from the collector region 116. During processing of the transistor 100, the layer 119 tends to acquire a dopant profile more similar to the emitter region 114 and poly layer 122, while the layer 117 takes on a dopant profile closer to that of the intrinsic base layer 112.

A low-resistance layer such as a layer 123 of silicide and/or metal is disposed over the poly layer 122. In one embodiment, as shown in FIG. 2, the poly layer 122 is self-aligned to the emitter 114, spaced therefrom by dielectric spacers 130, 132 disposed on a sidewall of the poly layer 122. However, such self-alignment is not a requirement for operation of the invention. In the embodiment illustrated in FIG. 2, the dielectric spacer includes both an oxide layer 132 contacting a sidewall of the poly layer 122 and a nitride spacer 130 overlying the oxide layer 132. The nitride spacer 130 in this embodiment has a front face contacting a sidewall of the emitter 114 and a rear face opposite the front face in contact with the oxide layer 132.

A layer 124 of polysilicon is also at least partially disposed over a shallow trench isolation region 126 to the side of the intrinsic base layer 112. A conductive contact via 144 to the collector is made to an active area 103 at a silicide layer 125 disposed over the active area 103 within an opening in the shallow trench isolation 126.

A layer of oxide 136 separates an upper portion 115 of the emitter region 114 from the layer of polysilicon 122. Spacer 158 is provided on exterior sidewalls of the upper portion of the emitter region 114. In addition, vertical contact to each of the raised extrinsic base 128, emitter region 114 and collector region 116 from a overlying wiring level (not shown) are provided through metal or metal-silicide filled vias 140, 142 and the collector contact via 144 that are etched into an overlying deposited interlevel dielectric layer (ILD) 146 and an additional dielectric layers 150. Desirably, dielectric layer 150 consists essentially of a nitride such as silicon nitride, and ILD 146 consists essentially of a deposited oxide, for example, a silicon dioxide such as an oxide deposited from a tetraethylorthosilicate (TEOS) precursor or a doped or undoped silicate glass, e.g., borophosphosilicate glass (BPSG).

Figure 3:
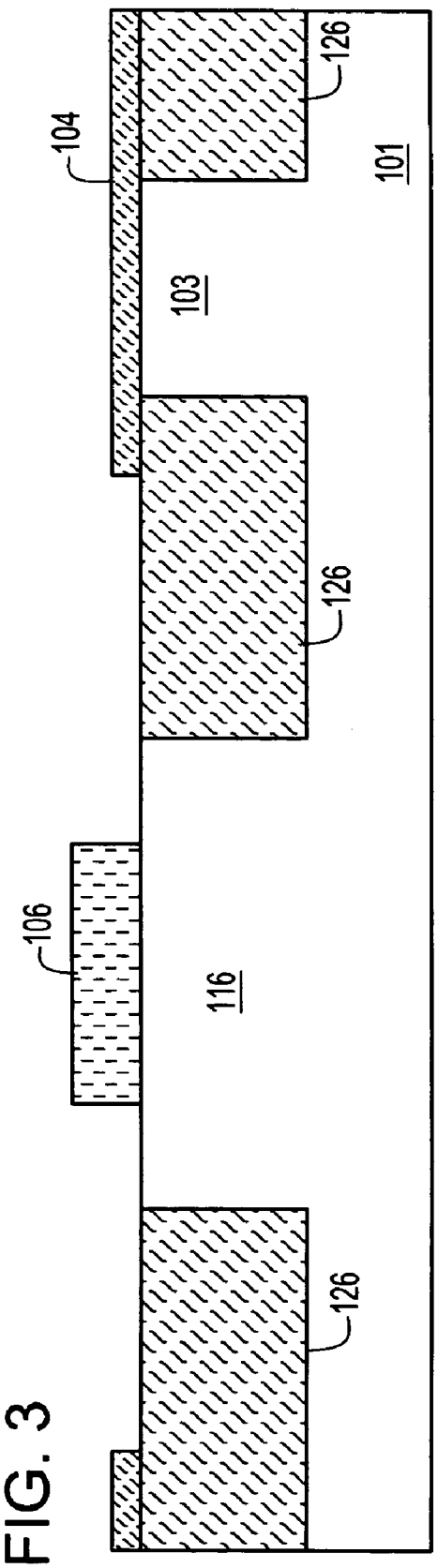

FIG. 3 illustrates a stage in fabrication of a bipolar transistor according to an embodiment of the invention. As shown therein, a collector region is disposed in a substrate 101, preferably consisting essentially of silicon, the collector region having an active collector region 116 disposed in an area of the substrate between shallow trench isolation (STI) regions 126. The collector region includes a reach-through region 103 disposed in an opening of the STI region 126 at a distance from the active collector region 116. FIG. 3 further shows a layer 104 of dielectric material, preferably an oxide, which is patterned to cover the reach-through region 103, while exposing the active region 116. As further shown, a patterned dielectric mask 106, preferably consisting of silicon nitride, is disposed over a portion of the active region 116. This nitride mask is preferably formed by depositing a layer of nitride and patterning it through photolithography and subsequent etching, selective to the oxide of region 104 and silicon.

Figure 4:
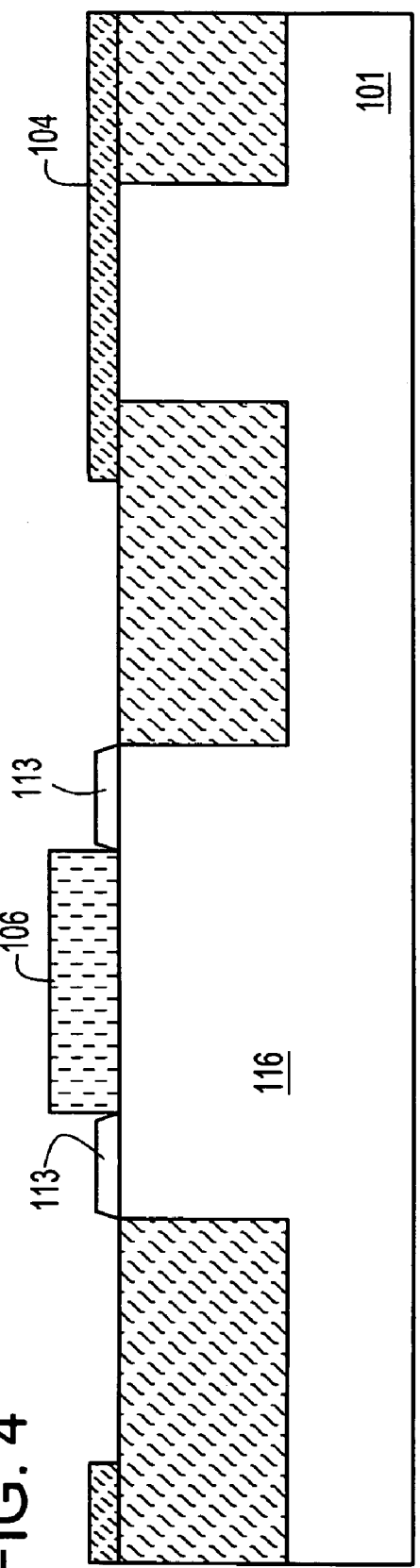

FIG. 4 illustrates a subsequent stage of processing, in which the semiconductor spacer layer 113 is grown by selective epitaxy, for example, on the exposed surface of the active region 116. During this step, the patterned nitride 106 and the oxide region 104 mask the selective growth process in other areas of the substrate 101. As stated above, the purpose of this layer is to provide an undoped or slightly doped region, which vertically spaces the collector region from the portion of the intrinsic base layer underlying the extrinsic base of the transistor. Preferably, spacer layer 113 is formed as an annular structure surrounding the nitride mask 106, which is disposed as a central region over the active region 116. To perform this step, a layer of intrinsic, i.e., not intentionally doped, silicon is epitaxially grown to form layer 113. Alternatively, the epitaxial layer 113 consists essentially of an alloy material such as silicon germanium (SiGe), or more preferably, silicon carbon (Si:C). Such materials reduce transport enhanced diffusion of dopants within the layer relative to silicon.

FIG. 5 illustrates a further stage in processing in which the nitride mask is removed and steps are performed to form the intrinsic base layer. First, the nitride mask is removed, as by isotropic etching selective to silicon and the material of the spacer layer 113. Thereafter, an intrinsic, i.e., one that is not intentionally doped, semiconductor layer 117 is epitaxially grown, followed by epitaxial growth of the intrinsic base layer 112, and growth of another intrinsic epitaxial layer 119 having characteristics similar to those of layer 117. This epitaxial growth process is performed non-selectively, so as to result in the formation of a layer of polysilicon 124 in areas that do not overlie the active region 116. Thereafter, a layer of oxide 125 and a layer of nitride 127 are deposited, in order, to form the structure shown.

Thereafter, as shown in FIG. 6, the nitride layer 127 and oxide layer 125 are lithographically patterned to form an emitter mandrel 129. This is done, for example, by first performing a reactive ion etch (RIE) selective to oxide, and then by a controlled isotropic etch to remove the oxide from the top surface of intrinsic layer 119.

Figure 7:
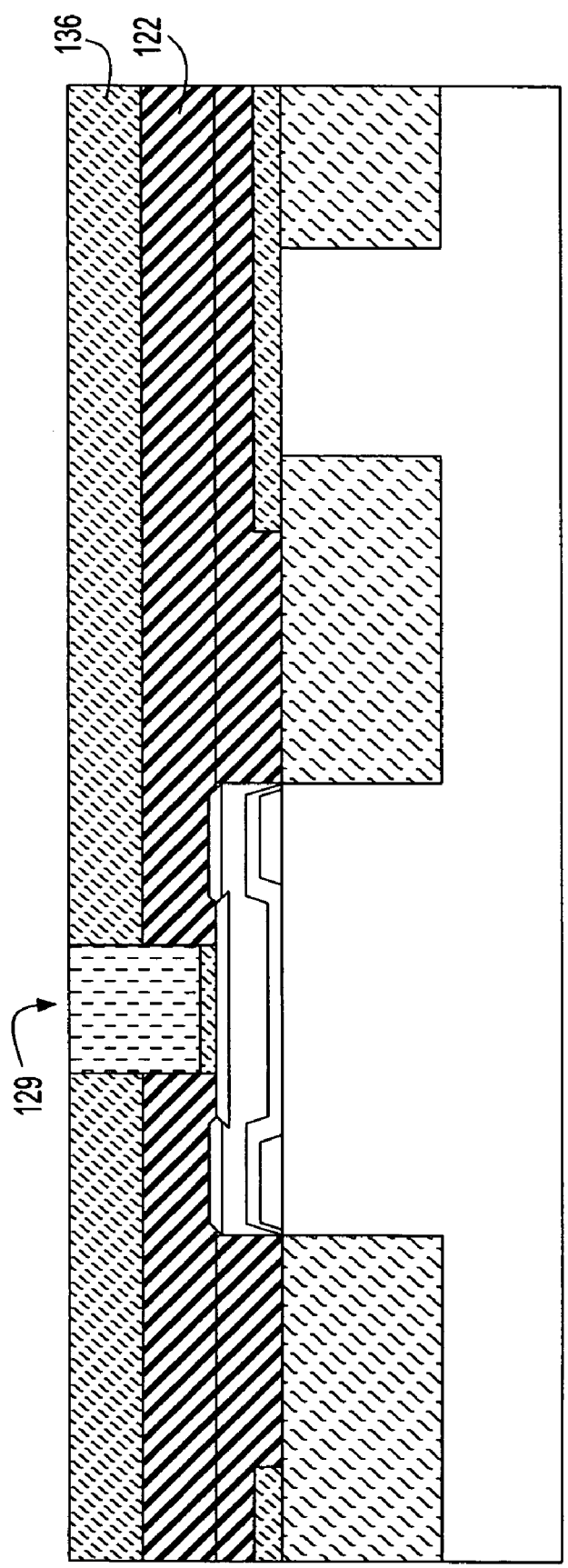

Thereafter, as shown in FIG. 7, a layer of polysilicon 122 is deposited or selectively grown, which will eventually become part of a raised extrinsic base. A further layer of oxide 136 is then also formed overlying the polysilicon layer 122. These are formed by depositing polysilicon and recessing or selectively growing the material to below the height of the mandrel 129, after which the oxide layer 136 is formed by thermal oxidation or by deposition and subsequent planarization, e.g., through chemical mechanical polishing (CMP).

Figure 8:
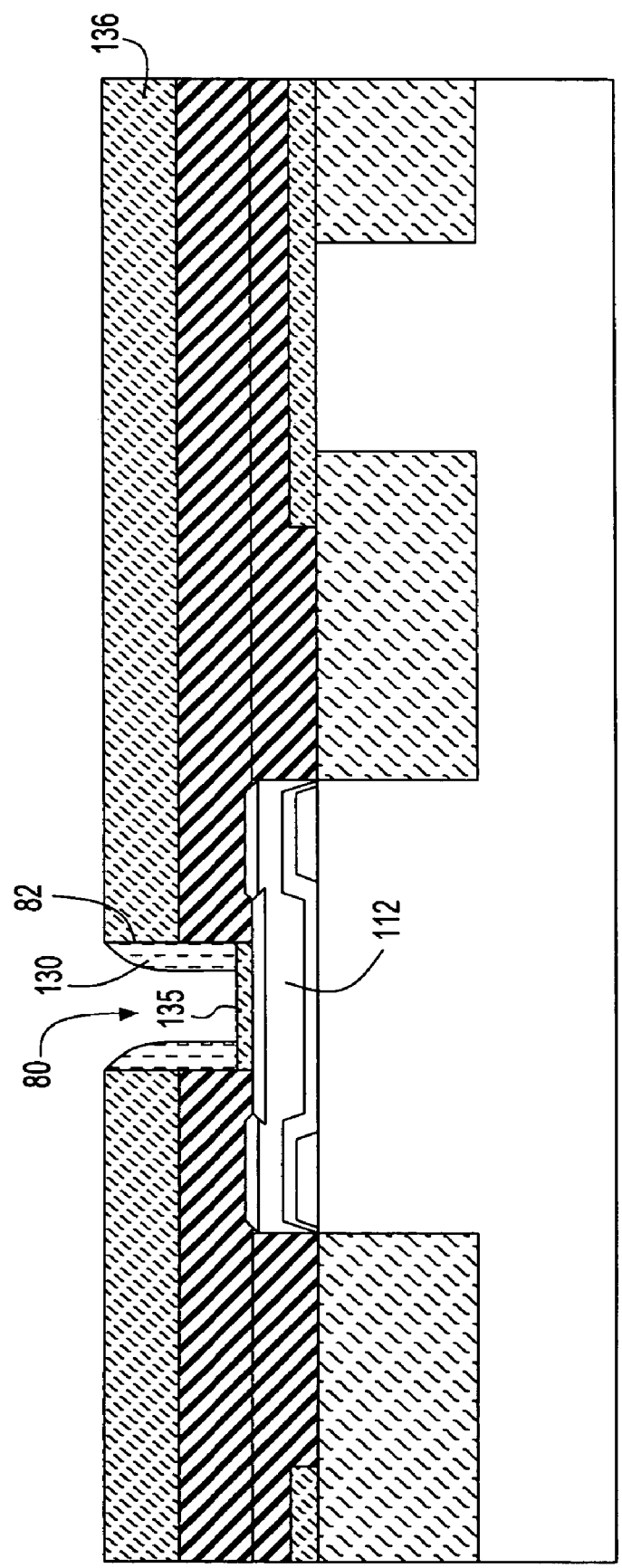

Thereafter, with reference to FIG. 8, the nitride portion of the mandrel is removed, stopping on the oxide layer 135, to result in an emitter contact hole 80. During the removal of the mandrel nitride portion, the overlying oxide layer 136 is used as a hard mask. Thereafter, a spacer consisting essentially of a dielectric material other than the oxide of oxide layer 136, for example, silicon nitride 130, is formed on the sidewall 82 of the hole. Alternatively, the spacer 130 consists essentially of another nitride such as silicon oxynitride, other suitable nitride, or other dielectric material. Such spacer is preferably formed by a conventional spacer fabrication technique of depositing a conformal layer of the spacer material and thereafter vertically etching the layer, as by RIE.

Thereafter, a series of steps are performed to form the emitter. In these steps, the oxide layer 135 that is exposed in the opening 80, where not covered by the nitride spacer 130, is wet stripped, using an etch process selective to the exposed material (silicon and/or silicon germanium) of the intrinsic base layer 112, and selective to nitride, to leave an opened oxide layer 132 (FIG. 9) in place. Doped polysilicon is then deposited to contact the intrinsic base layer 112 and fill the contact hole to form the emitter 114. A dielectric layer 150, preferably including a nitride such as silicon nitride, is deposited on the emitter polysilicon layer 114 to serve as a hardmask in a subsequent step.

Thereafter, a photoresist (not shown) is patterned to expose the dielectric layer 150 in areas except where it overlies the filled opening of the emitter 114. Next, the dielectric layer 150 is RIE etched according to the photoresist pattern. The photoresist is then stripped, and the emitter polysilicon 114 is then patterned, as by RIE, selective to the silicon nitride material of the dielectric layer 150 to pattern the upper portion 115 of the emitter and expose the oxide layer 136.

Figure 9:
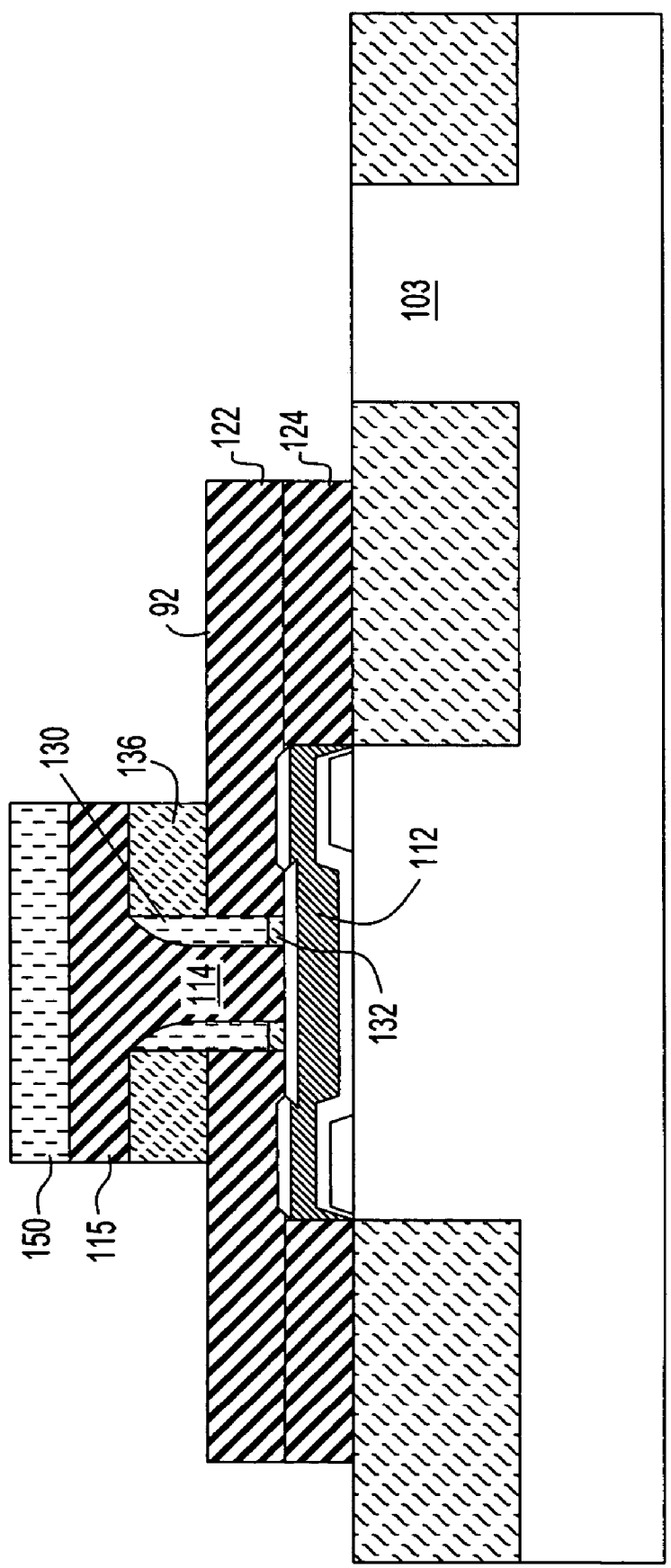

Thereafter, with continued reference to FIG. 9, a further photoresist pattern (not shown) is used to vertically etch the stack including oxide layer 136, polysilicon layers 122 and 124, which patterns the polysilicon portion of the raised extrinsic base, as well as to expose the top surface 92 of the poly layer 122 and to clear the oxide layer 104 (FIG. 3) disposed over the collector reach through region 103.

Figure 10:
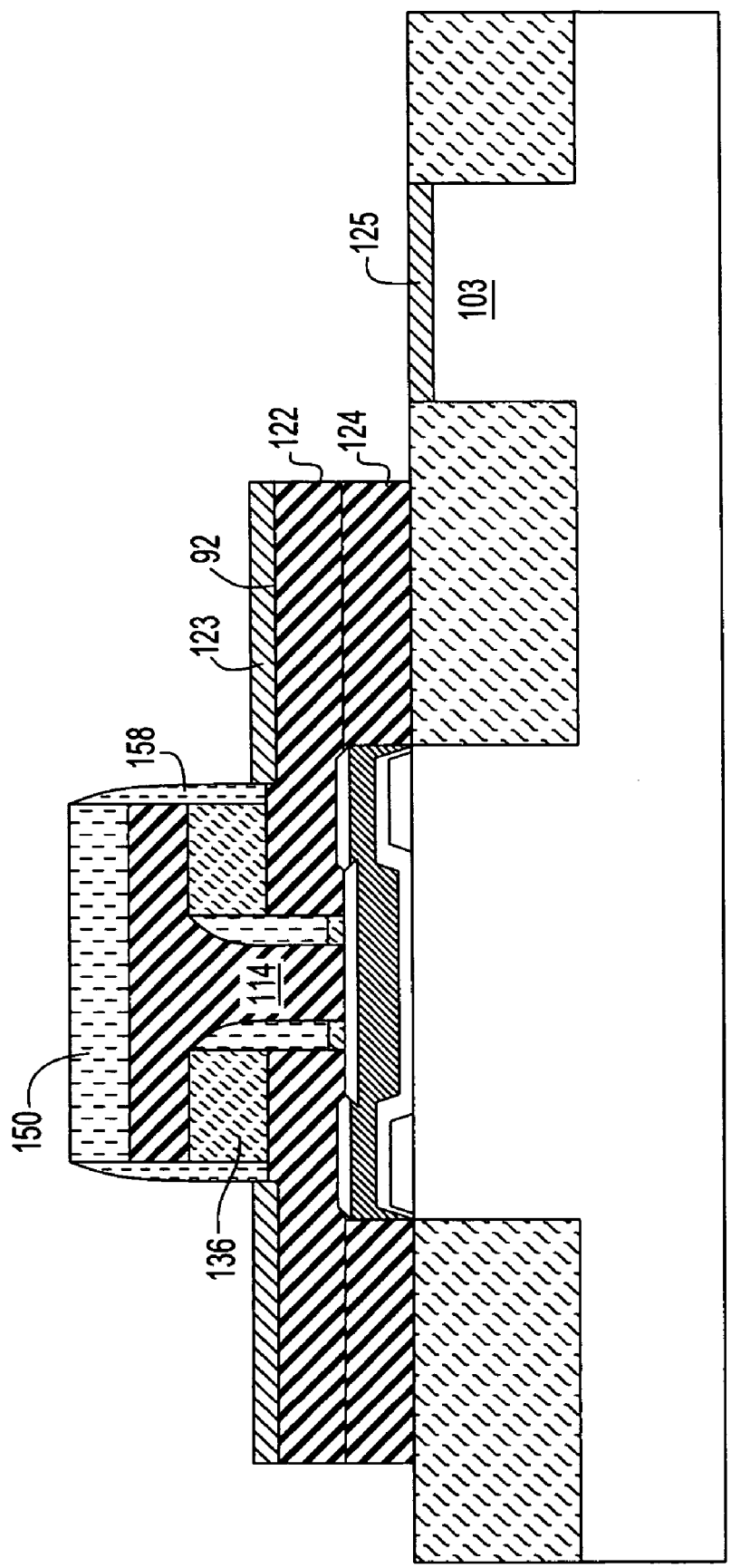

Thereafter, as shown in FIG. 10, nitride spacers 158 are formed on exposed sidewalls of the emitter 114 and the nitride and oxide layers 150, 136. In addition, a silicide layer 123 is now desirably formed on upwardly facing surfaces 92 of polysilicon layer 122 and silicide layer 125 is formed on the single-crystal silicon collector reach-through region 103. Such silicide is formed by depositing a metal that reacts with silicon under appropriate conditions, and thereafter applying conditions, e.g., moderately high temperature, to form the silicide. Unreacted metal is then removed selective to the silicide, leaving the silicide layers 123, 125 in place.

According to an alternative embodiment of the invention, the above-described processing can be altered to achieve modified, but similar results. For example, with reference to FIG. 2, in one alternative embodiment, when the epitaxial spacer layer 113 is grown, a small amount of dopants can be introduced, such that the layer is grown in a manner resulting in a slightly or very lightly doped layer. While the dopant concentration in the epitaxial spacer layer 113 is optimally made as low as possible, a relatively small dopant concentration, at several orders of magnitude lower than the dopant concentration of the intrinsic base layer 112 and the collector region 116, may still allow the benefits of the invention to be achieved, in view of the thickness of the spacer layer 113 separating the intrinsic base layer 112 from the collector region 116.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. A bipolar transistor, comprising:
   a collector provided in a single-crystal semiconductor region, said collector having an uppermost surface being a major surface extending in first and second directions defining a reference plane, said reference plane having a first portion, and a second portion extending outward from said first portion;
   an intrinsic base aligned with said first portion and not aligned with said second portion;
   an epitaxial spacer layer overlying said reference plane, said epitaxial spacer layer being aligned with said second portion and not aligned with said first portion;
   an emitter overlying and aligned with said intrinsic base and said first portion; and
   an extrinsic base overlying and aligned with said epitaxial spacer layer and not aligned with said intrinsic base.

2. The bipolar transistor as claimed in claim 1, wherein said extrinsic base has a lower surface spaced a first distance from said reference plane and said intrinsic base has a lower surface spaced a second distance from said reference plane, said second distance being less than said first distance.

3. The bipolar transistor as claimed in claim 2, wherein said epitaxial spacer layer has a first thickness and said first and second distances differ by an amount equal to said first thickness.

4. The bipolar transistor as claimed in claim 1, wherein said epitaxial spacer layer is not intentionally doped.

5. The bipolar transistor as claimed in claim 1, wherein said epitaxial spacer layer contains at mast a very light dopant concentration.

6. The bipolar transistor as claimed in claim 1, wherein said collector region has a first dopant concentration, said intrinsic base has a second dopant concentration, and said epitaxial spacer layer includes a semiconductor having a third dopant concentration which is lower than both said first and second dopant concentrations.

7. The bipolar transistor as claimed in claim 1, wherein said intrinsic base includes an epitaxial layer consisting essentially of a semiconductor alloy.

8. The bipolar transistor as claimed in claim 7, wherein said collector consists essentially of silicon and said intrinsic base consists essentially of silicon germanium.

9. The bipolar transistor as claimed in claim 1, wherein said epitaxial spacer layer consists essentially of a semiconductor alloy layer having a lower dopant diffusion rate than silicon.

10. The bipolar transistor as claimed in claim 9, wherein said epitaxial spacer layer consists essentially of silicon carbon.

11. The bipolar transistor as claimed in claim 10, wherein said epitaxial spacer layer consists essentially of silicon germanium.

12. The bipolar transistor as claimed in claim 11, wherein said epitaxial spacer layer includes carbon incorporated into said silicon germanium.

13. The bipolar transistor as claimed in claim 1, wherein said extrinsic base is raised.

14. The bipolar transistor as claimed in claim 13, wherein said extrinsic base is self-aligned to said emitter.

* * * * *